United States Patent
Shelton et al.

(10) Patent No.: US 11,711,067 B2
(45) Date of Patent: Jul. 25, 2023

(54) MICROMACHINED ULTRASOUND TRANSDUCER USING MULTIPLE PIEZOELECTRIC MATERIALS

(71) Applicant: InvenSense, Inc., San Jose, CA (US)

(72) Inventors: Stefon Shelton, Oakland, CA (US); Andre Guedes, Lisbon (PT); Richard Przybyla, Emeryville, CA (US); Meng-Hsiung Kiang, Berkeley, CA (US); David Horsley, Berkeley, CA (US)

(73) Assignee: InvenSense, Inc., San Jose, CA (US)

( * ) Notice: Subject to any disclaimer, the term of this patent is extended or adjusted under 35 U.S.C. 154(b) by 559 days.

(21) Appl. No.: 16/794,099

(22) Filed: Feb. 18, 2020

(65) Prior Publication Data

US 2020/0266798 A1   Aug. 20, 2020

Related U.S. Application Data

(63) Continuation of application No. 15/342,719, filed on Nov. 3, 2016, now Pat. No. 10,566,949, which is a
(Continued)

(51) Int. Cl.
*H03H 9/17* (2006.01)
*B06B 1/06* (2006.01)
(Continued)

(52) U.S. Cl.
CPC ........... *H03H 9/174* (2013.01); *B06B 1/0603* (2013.01); *H03H 9/02244* (2013.01);
(Continued)

(58) Field of Classification Search
CPC ... H03H 9/174; B06B 1/0603; H01L 41/0973; H01L 41/187; H01L 41/1873;
(Continued)

(56) References Cited

U.S. PATENT DOCUMENTS

| 6,087,198 A | 7/2000 | Panasik |
| 10,566,949 B2 | 2/2020 | Shelton et al. |

(Continued)

FOREIGN PATENT DOCUMENTS

| EP | 2562836 A1 | 2/2013 |
| WO | 2011129855 | 10/2011 |

OTHER PUBLICATIONS

Extended European Search Report for EP15789257.1 dated Dec. 13, 2017.
(Continued)

*Primary Examiner* — Bryan P Gordon

(57) ABSTRACT

A transducer includes first and second piezoelectric layers made of corresponding different first and second piezoelectric materials and three or more electrodes, implemented in two or more conductive electrode layers. The first piezoelectric layer is sandwiched between a first pair of electrodes and the second piezoelectric layer is sandwiched between a second pair of electrodes. The first and second pairs of electrodes contain no more than one electrode that is common to both pairs.

19 Claims, 6 Drawing Sheets

Related U.S. Application Data continuation of application No. PCT/US2015/024114, filed on Apr. 2, 2015.

(60) Provisional application No. 61/991,408, filed on May 9, 2014.

(51) Int. Cl.
| | | |
|---|---|---|
| *H04R 17/00* | (2006.01) | |
| *H10N 30/853* | (2023.01) | |
| *H10N 30/20* | (2023.01) | |
| *H03H 9/02* | (2006.01) | |
| *H03H 9/15* | (2006.01) | |

(52) U.S. Cl.
CPC ............ *H03H 9/178* (2013.01); *H04R 17/00* (2013.01); *H10N 30/2047* (2023.02); *H10N 30/853* (2023.02); *H10N 30/8542* (2023.02); *H10N 30/8554* (2023.02); *H03H 2009/155* (2013.01)

(58) Field of Classification Search
CPC ............ H01L 41/1876; H10N 30/8542; H10N 30/2047; H10N 30/8554; H10N 30/853
See application file for complete search history.

(56) References Cited

U.S. PATENT DOCUMENTS

| | | |
|---|---|---|
| 2003/0013870 A1 | 1/2003 | Nicolaou |
| 2003/0173870 A1 | 9/2003 | Hsu |
| 2004/0027216 A1 | 2/2004 | Ma et al. |
| 2008/0024563 A1 | 1/2008 | Matsui et al. |
| 2008/0122317 A1 | 5/2008 | Fazzio et al. |
| 2011/0304412 A1 | 12/2011 | Zhang |
| 2012/0306316 A1 | 12/2012 | Nakamura et al. |
| 2013/0162102 A1* | 6/2013 | Sammoura ............ B06B 1/0603 310/321 |
| 2014/0139071 A1 | 5/2014 | Yamamoto et al. |
| 2016/0240768 A1* | 8/2016 | Fujii .................. H10N 30/2042 |
| 2017/0194934 A1* | 7/2017 | Shelton ............. H10N 30/8542 |
| 2017/0368574 A1* | 12/2017 | Sammoura ............ B06B 1/0622 |

OTHER PUBLICATIONS

Final Office Action dated Jun. 28, 2019 for U.S. Appl. No. 15/342,719.
International Search Report and Written Opinion for PCT/US2015/024114 dated Sep. 10, 2017.
Non-Final Office Action for U.S. Appl. No. 15/342,719, dated Mar. 4, 2019.
U.S. Appl. No. 61/991,408, to Stefon Shelton, filed May 9, 2014.

* cited by examiner

MICROMACHINED ULTRASOUND TRANSDUCER USING MULTIPLE PIEZOELECTRIC MATERIALS

CLAIM OF PRIORITY

This application is a continuation of U.S. Pat. No. 10,566,949, U.S. patent application Ser. No. 15/342,719, filed Nov. 3, 2016, the content of which are incorporated herein by reference in their entirety. U.S. Pat. No. 10,566,949 is a continuation of International Patent Application Number PCT/US2015/024114 filed Apr. 2, 2015, the entire contents of which are incorporated herein by reference in their entirety. International Patent Application Number PCT/US2015/024114 claims the priority benefit of U.S. Provisional Patent Application No. 61/991,408, filed May 9, 2014, the entire disclosures of which are incorporated by reference.

STATEMENT REGARDING FEDERALLY SPONSORED RESEARCH OR DEVELOPMENT

This invention was made with Government support under IIP-1346158 awarded by the National Science Foundation. The Government has certain rights in this invention. 45 CFR 650.4(f)(4)

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

FIELD OF THE DISCLOSURE

The present disclosure is generally related to micromachined ultrasound transducers and more particularly optimizing the transmit and receive sensitivity of piezoelectric micromachined ultrasound transducers (PMUTs) through the use of two distinct piezoelectric materials.

BACKGROUND

Traditionally, PMUTs use either a bi- or unimorph structure. A unimorph structure consists of a single active layer of piezoelectric material sandwiched between two electrodes coupled with a passive bending layer. To transmit ultrasound, a voltage is applied across the electrodes, which induces a transverse stress in the piezoelectric layer via the inverse piezoelectric effect, resulting in an out-of-plane deflection which transmits an ultrasonic pressure wave into a gas or fluid. Similarly, when the PMUT is used as a receiver, the applied pressure results in out-of-plane bending and the generation of measureable charge via the direct piezoelectric effect. Bimorph structures utilize two piezoelectric layers between patterned electrodes and are typically driven differentially. Since these approaches only use a single piezoelectric material, the piezoelectric material constants (piezoelectric coefficients, dielectric constant, Young's modulus, etc.) of the chosen piezoelectric material are only optimized for a single mode of operation, i.e., transmitter or receiver. The inability to optimize the transducer's sensitivity for both transmitter and receiver modes results in significant reduction in the system performance for ultrasonic systems commonly used in medical imaging, ranging, non-destructive testing, ultrasonic data communication, and gesture recognition applications.

BRIEF SUMMARY OF THE DISCLOSURE

An aspect of the present disclosure is to provide a transducer that is optimized for use both as an ultrasound transmitter and as an ultrasound receiver by using multiple piezoelectric materials.

BRIEF DESCRIPTION OF THE SEVERAL VIEWS OF THE DRAWINGS

The invention will be more fully understood by reference to the following drawings which are for illustrative purposes only.

DETAILED DESCRIPTION

The present invention generally comprises a method to improve the performance of piezoelectric micromachined ultrasound transducers, of any shape, through the use of different piezoelectric materials for each mode of operation. More specifically, the invention provides a method to increase the transmit and receive sensitivity of an ultrasound transducer operating both as a transmitter and as a receiver. Aspects of the present disclosure apply to devices consisting of a single transducer or multiple transducers in an array.

In the discussion that follows the term "electrode layer" is used to refer to a layer of conductive material, e.g., a metal, which may be patterned to form one or more "electrodes" (sometimes called contacts).

According to aspects of the present disclosure, a piezoelectric micromachined ultrasound transducer incorporates multiple distinct piezoelectric materials for operation as a transmitter and as a receiver. Using layers of piezoelectric materials with different properties, such as, but not limited to: Young's modulus, piezoelectric coefficients, dielectric constant, and Poisson's ratio, transducer performance can be optimized to both transmit and receive sound. The described method applies to individual transducers as well as 1D and 2D arrays of transducers fabricated on a common substrate.

The transducer includes first and second piezoelectric layers made of corresponding different first and second piezoelectric materials and three or more electrodes, implemented in two or more conductive electrode layers. The first piezoelectric layer is sandwiched between a first pair of electrodes and the second piezoelectric layer is sandwiched between a second pair of electrodes. The first and second pairs of electrodes contain no more than one electrode that is common to both pairs.

Figure 1:
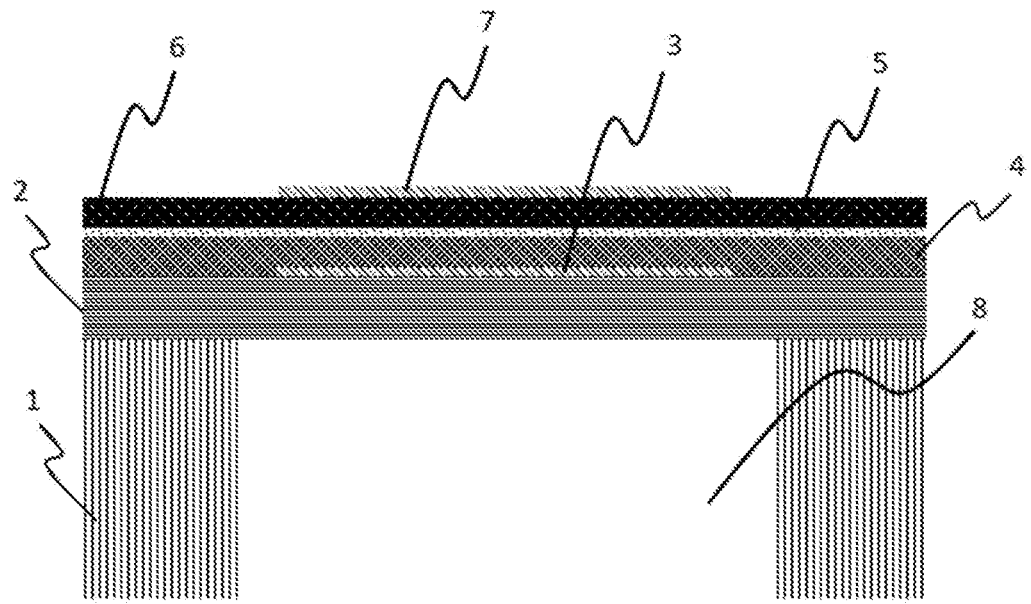
FIG. 1 is a cross section of a circular embodiment of a dual material PMUT with a structural layer beneath the piezoelectric layers.

FIG. 1 shows a possible embodiment of the transducer, in cross section, according to the present invention. The PMUT consists of a suspended thin plate structure. The substrate 1 forms the supporting layer and is patterned to release the thin plate structure. The structural layer 2 provides additional plate thickness, thereby decreasing the sensitivity to residual stress in the thin film layers as well as enabling PMUTs to be fabricated with a range of possible operating frequencies, as required by different applications. The patterned receiver electrode 3 and the receiver piezoelectric layer 4, with material properties (piezoelectric coefficients, dielectric constant, Young's modulus, etc.) chosen for maximum receiver sensitivity, are deposited on top of the structural layer 2. Finally the ground electrode 5 and transmitter piezoelectric layer 6, with material properties optimized for maximum output pressure per input voltage, are deposited and patterned along with the transmit electrode 7. In the embodiment shown in FIG. 1, the electrodes 3 and 7 are shown as a circular electrode in the center of the suspended plate but other configurations, an outer ring for example, can be employed. In some implementations, the substrate 1 may act as an electrode if it is made of a semiconducting material, such as silicon. In such an implementations, one of the metal layers that form electrodes 3, 5, 7, e.g., the layer forming the ground electrode 5, may be omitted. An acoustic resonator tube 8 is incorporated into the design, e.g., by forming an opening through the substrate 1 to a back side of the structural layer 2. The combination of the structural layer 2, piezoelectric layers 4, 6 and the metal layers 3, 5, and 7 is sometimes referred to as a diaphragm or membrane.

Figure 2:
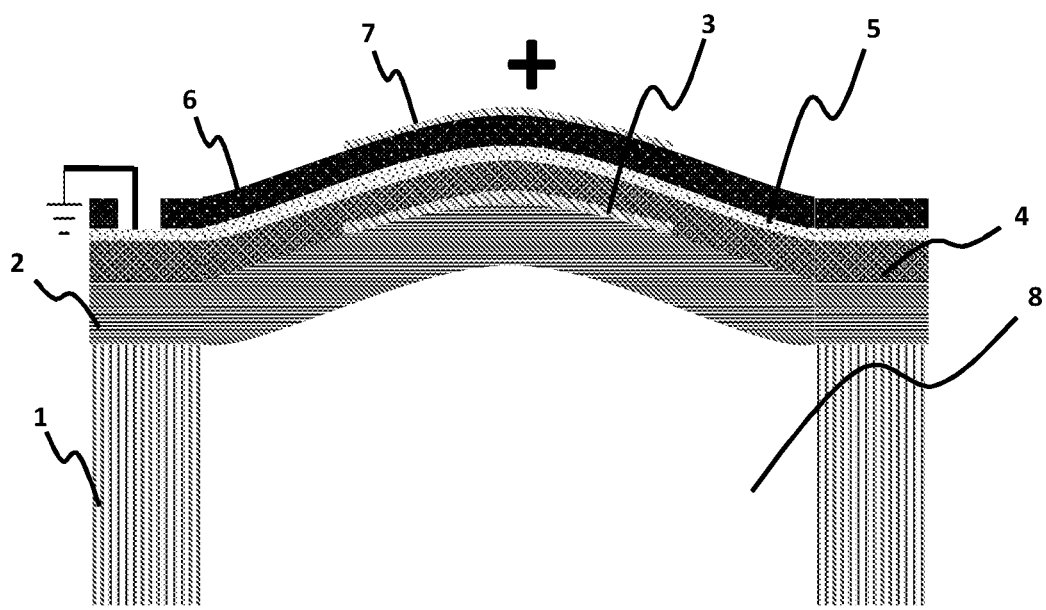
FIG. 2 is a cross section showing PMUT deflection under applied voltage.

In transmitter mode, a voltage is applied between the transmitter electrode 7 and the ground electrode 5 as shown in FIG. 2. Due to the inverse piezoelectric effect, transverse stress is generated in the transmitter piezoelectric layer 6, chosen for its desirable material properties in transmitter mode, which results in out of plane deflection. Reversing the voltage polarity, we obtain deflection in the opposite direction. The vibrating plate displaces gas or fluid, transmitting a pressure wave. Similarly, in receiver mode, an incoming pressure wave deflects the plate, generating a stress gradient in the receiver piezoelectric layer 4, chosen to optimize receiver mode performance, which generates charge on the receiver electrode 3 and ground electrode 5 via the direct piezoelectric effect. The charge is measured electrically.

By way of example, and not of limitation, one example of a dual material transducer is a combination aluminum nitride (AlN) and Lead Zirconate Titanate (PZT) transducer. In this embodiment, PZT is chosen as the transmitter mode piezoelectric layer 6 due to its favorable transverse piezoelectric coefficient, $e_{31}$, which is approximately 15× larger than that of AlN. Since the output pressure is directly proportional to the piezoelectric coefficient, we can realize an increase in output pressure by using the PZT as the piezoelectric layer when transmitting. However, in receiver mode, the large dielectric constant of PZT and consequent increase in capacitance results in severely degraded receiver sensitivity relative to AlN. Therefore, due to its 100× lower dielectric constant, AlN is used as the receiver piezoelectric layer 4. Alternative piezoelectric materials such as Potassium Sodium Niobate KNN ($K_xNa_{1-x}NbO_3$) or PMN-PT (Lead Magnesium Niobate-Lead Titanate) may be used in place of PZT, while alternative materials such as ZnO may be used in place of AlN. By enabling the use of materials with different material properties for different modes of operation, the performance of the composite transducer can be significantly improved compared to a transducer using a single piezoelectric material.

By way of example, and not of limitation, the thickness of the structural layer 2 may be from 0.5 micron to 40 microns, and more specifically from 1 micron to 10 microns. The thickness of the piezoelectric layers 4 and 6 may be from 0.2 microns to 6 microns, and more specifically from 0.5 microns to 2.5 microns. The diameter of the transducer resonator tube 8 may be from 30 microns to 4000 microns, and specifically from 100 microns to 1500 microns, and more specifically from 400 microns to 1000 microns. The length of the acoustic resonator tube 8 may be from 10 microns to 4000 microns and more specifically from 150 microns to 450 microns. The operating frequency of the transducer may be from 1 kHz to 100 MHz, and specifically from 10 kHz to 1 MHz, and more specifically from 50 kHz to 500 kHz. The metal layer beneath the AlN piezoelectric layer may be Mo or Pt or Al, and may range in thickness from 100 nm to 500 nm.

Figure 3A:
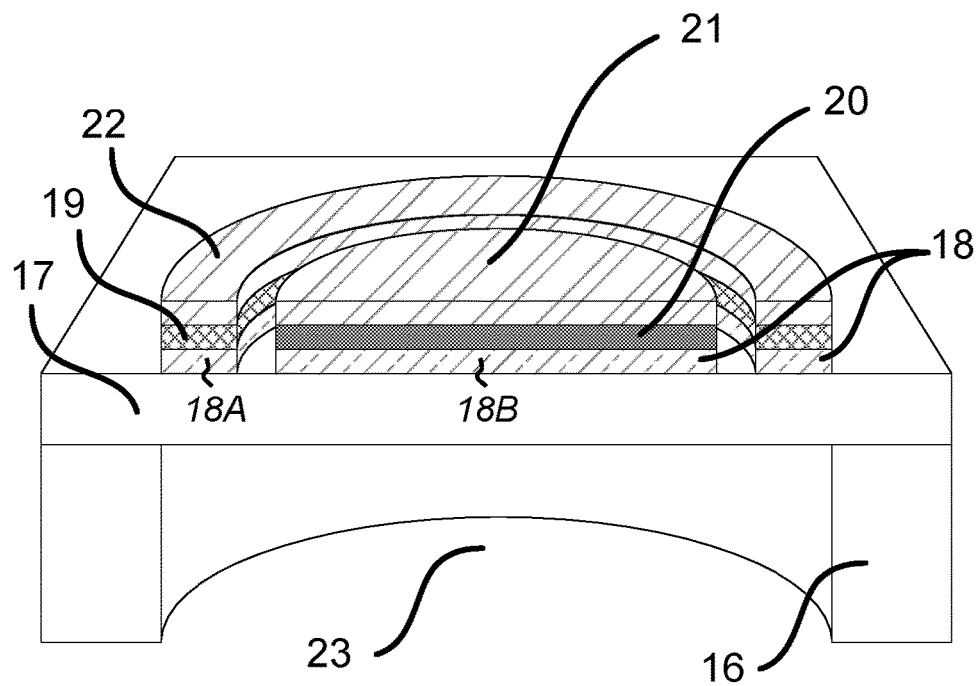
FIG. 3A is an isometric view of an embodiment of a dual material PMUT with annular and circular electrodes.

In another embodiment, shown in FIG. 3A rather than depositing the second piezoelectric material on top of the first piezoelectric material, the two materials can be sequentially deposited and patterned such that both materials and their associated bottom metal electrodes are both deposited directly onto the structural layer 17 which is formed on a surface of a substrate 16. FIG. 3A illustrates an example of an implementation in which there are four "electrodes" but only two "electrode layers". By way of example, and not of limitation, in the circular transducer embodiment shown in FIG. 3A, the transmitter piezoelectric material 19 is patterned to occupy an annular ring at the outer diameter of the transducer, with a transmitter electrode 22 patterned on top of the transmitter piezoelectric material 19. The transmitter piezoelectric material 19 and a receiver piezoelectric material 20 are formed on a lower electrode layer 18 that is patterned into two bottom electrodes 18A, 18B. An upper electrode layer formed over the transmitter piezoelectric material 19 and receiver piezo electric material 20 is patterned to form a corresponding transmitter electrode 22 and receiver electrode 21.

In this example the transmitter piezoelectric material 19, transmitter electrode 22, receiver piezoelectric material 20 and receiver electrode 21 are formed over an opening 23 in the substrate 16. The opening frees structural layer 17 from the substrate 16, allowing the membrane to vibrate. The length of the opening may be selected so that it acts as a resonator tube. The receiver piezoelectric material 20 is patterned into a circular region at the center of the transducer overlying the opening 23 with its accompanying receiver electrode 21. In addition to using a single electrode for transmitting and receiving, with the annular and central electrode configuration it is possible to differentially drive the transmitter and receiver electrodes to increase the increase the output pressure per volt.

Figure 3B:
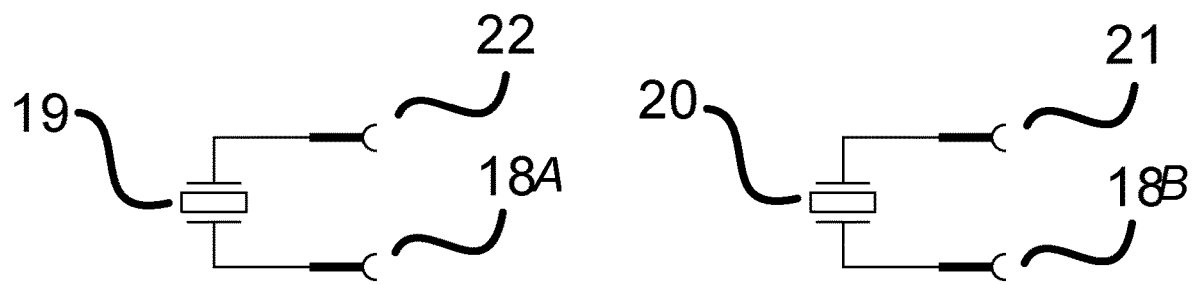
FIG. 3B is an electrical schematic illustrating an equivalent circuit to the PMUT shown in FIG. 3A.

An equivalent circuit of the embodiment from FIG. 3A, illustrating the electrical connections to the first and second piezoelectric materials, is shown in FIG. 3B. The transmitter piezoelectric material 19 has two electrical contacts, top contact 22 and bottom contact 18A. Similarly, the receiver piezoelectric material 20 has two electrical contacts, top contact 21 and bottom contact 18B. Referring to FIG. 3A, while both of the bottom contacts 18A, 18B are made in the bottom electrode layer 18, they can be electrically isolated, as shown in FIG. 3B, or they may be connected together.

Figure 4A:
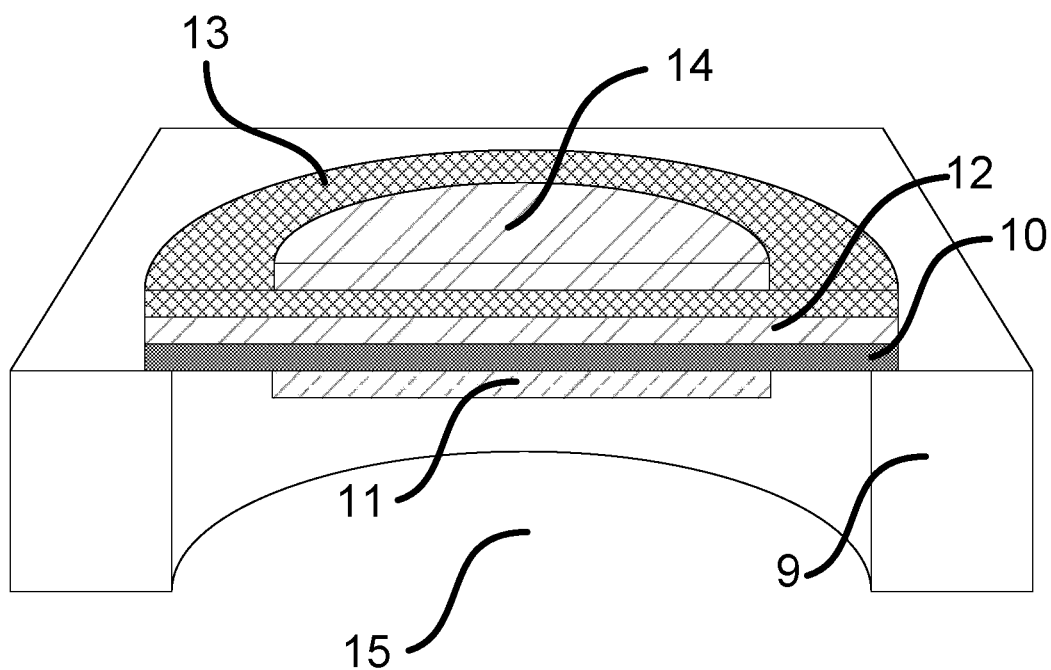
FIG. 4A is an isometric view of an additional circular embodiment of a dual material PMUT without the additional structural layer.

In another embodiment, and for specific design configurations and applications, the structural layer may be omitted from the layer stack. This embodiment is shown in FIG. 4A. Piezoelectric layers 10, 13, and a ground electrode layer 12 are sandwiched between receiver electrode layer 11 and transmitter electrode layer 14 that overlie an opening 15 in substrate 9. In transmitter mode, a voltage is applied between the top electrode layer 14 and the ground electrode layer 12, thereby developing piezoelectric stress in the transmitter piezoelectric layer 13. The receiver piezoelectric layer 10 acts as the passive structural layer, so that transverse piezoelectric stress in transmitter piezoelectric layer 13 results in an out-of-plane deflection of the structure. In receiver mode, the transmitter piezoelectric layer 13 acts as the structural layer. In this case an incoming pressure wave deflects the plate, generating transverse stress in the receiver piezoelectric layer 10, which generates a charge on the receiver electrode layer 11 via the direct piezoelectric effect. The charge is measured electrically.

Figure 4B:
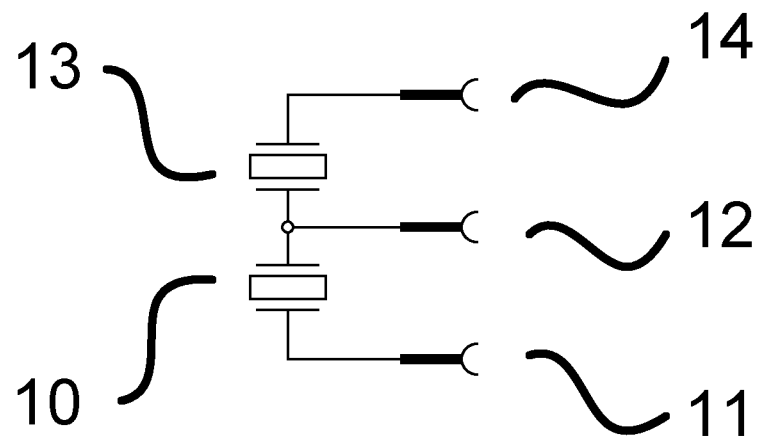
FIG. 4B is an equivalent circuit of the embodiment from FIG. 4A.

An equivalent circuit of the embodiment from FIG. 4A, illustrating the electrical connections to the first and second piezoelectric materials, is shown in FIG. 4B. The transmitter piezoelectric layer 13 has two electrical contacts, a top contact formed from the transmitter electrode layer 14 and a bottom contact formed by the ground electrode layer 12. Similarly, the receiver piezoelectric layer 10 has two electrical contacts, a top contact formed from the receiver electrode layer 11 and bottom contact formed by the ground electrode layer 12.

Figure 4C:
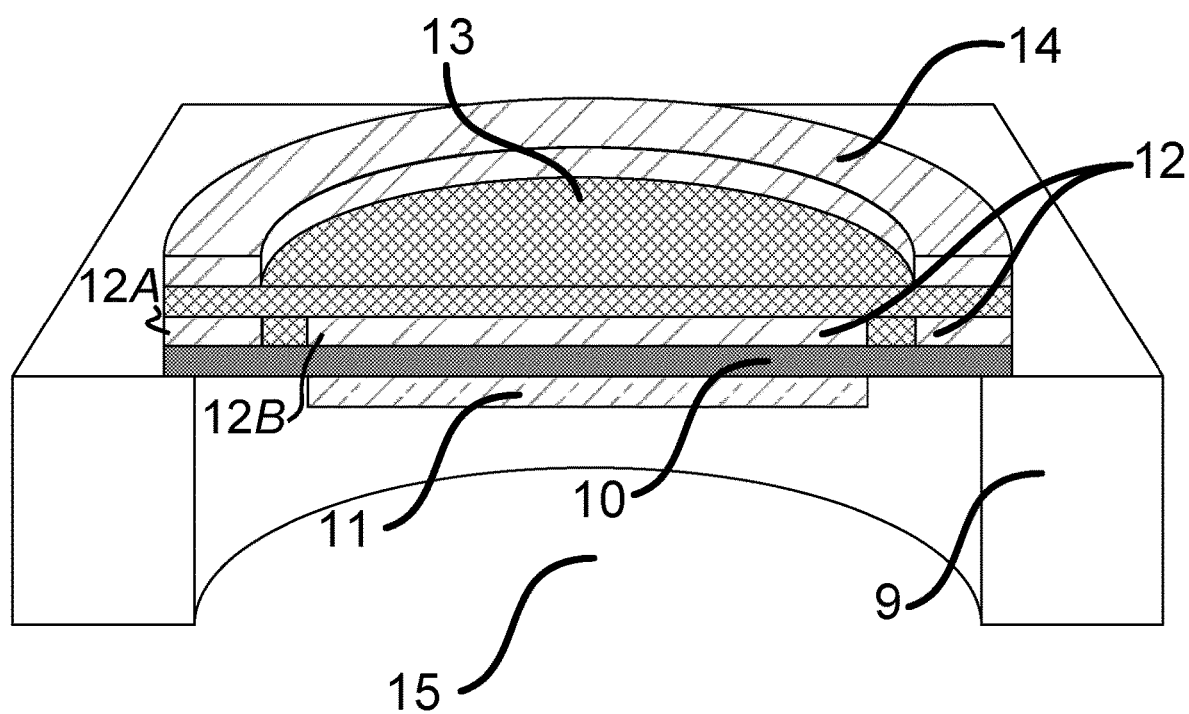
FIG. 4C is an isometric view of yet another embodiment in which there are four "electrodes" but only three "electrode layers".

While FIG. 4A and FIG. 4B both show a common bottom contact formed by the ground electrode layer 12 for both the transmitter piezoelectric layer 13 and receiver piezoelectric layer 10, FIG. 4C shows another embodiment in which these contacts are electrically isolated by patterning the ground electrode layer 12. FIG. 4C illustrates an example in which there are four "electrodes" but only three "electrode layers". Referring to FIG. 4C, piezoelectric layers 10, 13, and ground electrodes 12A, 12B formed from ground electrode layer 12 are sandwiched between receiver and transmitter electrodes 11, 14 that overlie an opening 15 in substrate 9. In transmitter mode, a voltage is applied between the annular ring top electrode 14 and the annular ring ground electrode 12A, thereby developing piezoelectric stress in the transmitter piezoelectric layer 13. The receiver piezoelectric layer 10 acts as the passive structural layer, so that transverse piezoelectric stress in transmitter layer 13 results in an out-of-plane deflection of the structure. In receiver mode, the transmitter piezoelectric layer 13 acts as the structural layer. In this case an incoming pressure wave deflects the plate, generating transverse stress in the receiver piezoelectric layer 10, which develops charge on the central circular receiver electrode 11 and the central circular ground electrode 12B.

Figure 5A:
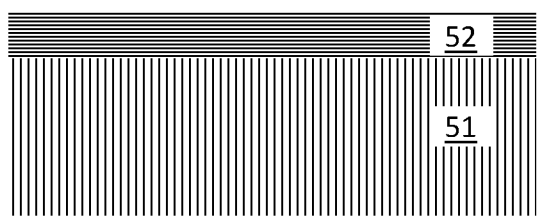
FIGS. 5A-5F are a sequence of cross sections depicting an example of process flow for fabricating a PMUT in accordance with aspects of the present disclosure.
Figure 5B:
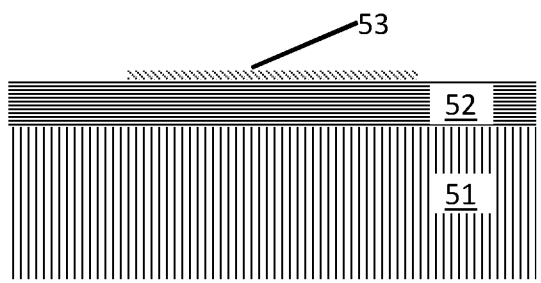
Figure 5C:
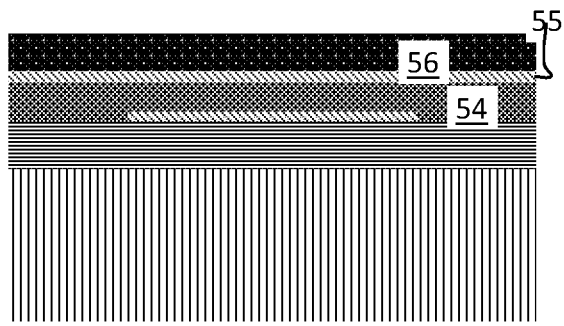
Figure 5D:
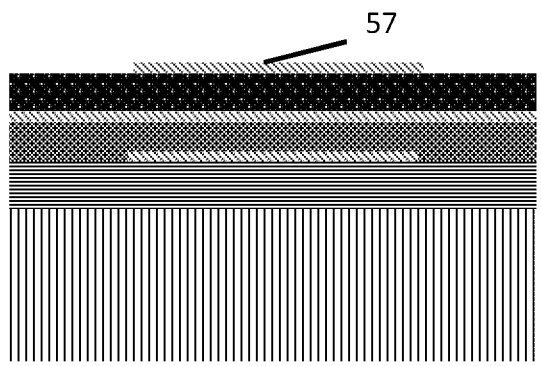
Figure 5E:
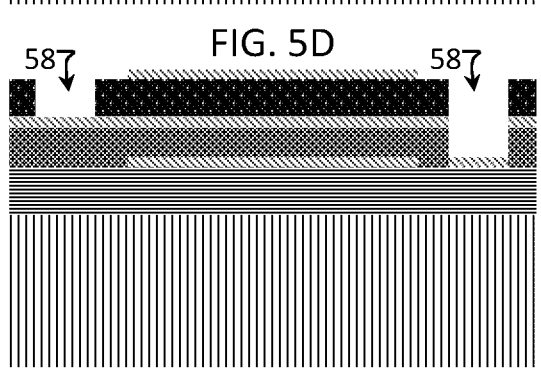
Figure 5F:
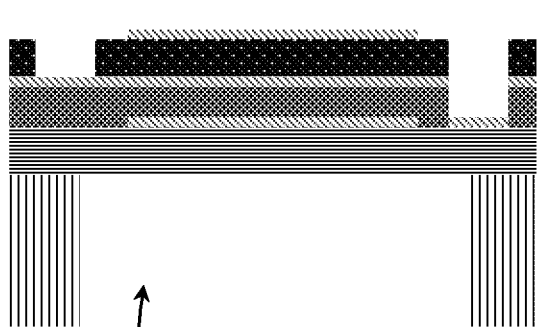

The embodiments can be produced using standard microelectro-mechanical systems (MEMS) processing technologies. An example process flow is outlined in FIGS. 5A-5F. The process starts with the deposition of a structural layer 52 on a substrate 51, as depicted in FIG. 5A. By way of example, and not by way of limitation, the structural layer 52 may be single crystal silicon, polysilicon, silicon nitride or silicon dioxide. A metal receiver electrode 53 is then patterned using lithography and etching, as shown in FIG. 5B. A receiver piezoelectric layer 54, metal electrode 55, and transmitter piezoelectric layers 56 are deposited and the transmitter electrode 57 is patterned on top as shown in FIG. 5C to FIG. 5D. Vias 58 are etched to expose the interconnect to the individual electrodes, as shown in FIG. 5E. Finally, as seen in FIG. 5F, the plate structure is released and an acoustic resonator tube 59 formed, e.g., by a deep reactive ion etch (DRIE).

Figure 6:
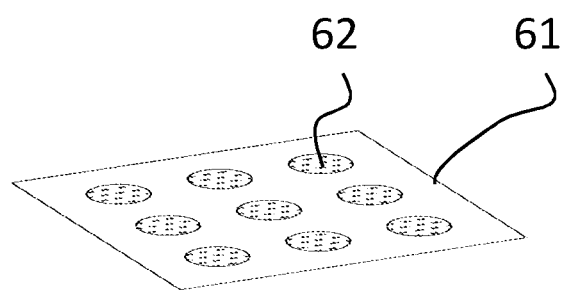
FIG. 6 is an isometric view of an embodiment of an array of dual material PMUT devices.

Aspects of the present disclosure include implementations in which multiple transducers of the type described herein are formed in a common substrate as an array. FIG. 6 depicts an example of an array 60 containing multiple transducers 61 formed on a common substrate 62.

From the description herein it will be appreciated that the invention can be embodied in various ways which include, but are not limited to:

1. A piezoelectric micromachined ultrasound transducer with a diaphragm of any shape incorporating distinct piezoelectric materials for transmitter and receiver operation.

2. The piezoelectric micromachined ultrasound transducer recited in any preceding embodiment, wherein the transducer is an element of an array of transducers; and wherein the array comprises a plurality of transducers on a substrate.

3. The piezoelectric micromachined ultrasound transducer recited in any preceding embodiment, wherein the transducer diaphragm is square, rectangular, hexagonal, circular, or elliptical in shape.

4. The piezoelectric micromachined ultrasound transducer recited in any preceding embodiment, wherein any of the piezoelectric materials used are Aluminum Nitride (AlN), Zinc Oxide (ZnO), Potassium Sodium Niobate KNN ($K_xNa_{1-x}NbO_3$), PMN-PT (Lead Magnesium Niobate-Lead Titanate), or Lead Zirconate Titanate (PZT).

5. The piezoelectric micromachined ultrasound transducer recited in any preceding embodiment, wherein the structural layer is Silicon (Si), polycrystalline Si, Silicon Dioxide ($SiO_2$), or Silicon Nitride ($Si_3N_4$).

Although the description herein contains many details, these should not be construed as limiting the scope of the invention but as merely providing illustrations of some of the aspects of the present disclosure. For example, a transducer may include more than two piezoelectric layers and more than three electrodes. Therefore, it will be appreciated that the scope of the present invention fully encompasses other embodiments which may become obvious to those skilled in the art.

All cited references are incorporated herein by reference in their entirety. In addition to any other claims, the applicant(s)/inventor(s) claim each and every embodiment of the invention described herein, as well as any aspect, component, or element of any embodiment described herein, and any combination of aspects, components or elements of any embodiment described herein.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35

USC § 112, ¶ 6. In particular, the use of "step of" in the claims herein is not intended to invoke the provisions of 35 USC § 112, ¶ 6.

We claim:
1. A transducer device comprising:
   a substrate with a structural layer for supporting a membrane, the membrane comprising:
      first and second piezoelectric layers made of corresponding different first and second piezoelectric materials, wherein one of the first and second piezoelectric material is optimized for transmitter mode operation and another of the first and second piezoelectric materials is optimized for receiver mode operation; and
      three or more electrodes, implemented in two or more conductive electrode layers, wherein the first piezoelectric layer is formed directly on the structural layer over an opening in the substrate, wherein the first piezoelectric layer is sandwiched between a first pair of electrodes of the three or more electrodes and wherein the second piezoelectric layer is sandwiched between a second pair of electrodes of the three or more electrodes, wherein the first and second pairs of electrodes contain no more than one electrode of the three or more electrodes that is common to both the first pair and the second pair, wherein at least two electrodes are in a same conductive electrode layer.
2. The transducer device of claim 1, wherein the transducer is an element of an array of transducers, and wherein the array comprises a plurality of transducers on a substrate.
3. The transducer device of claim 1, wherein the first and second piezoelectric layers and the two or more conductive electrode layers form a diaphragm that is square, rectangular, hexagonal, circular, or elliptical in shape.
4. The transducer device of claim 1, wherein any of the first and second piezoelectric materials includes Aluminum Nitride (AlN), Zinc Oxide (ZnO), Potassium Sodium Niobate (KNN) or Lead Zirconate Titanate (PZT).
5. The transducer device of claim 1, wherein the first and second piezoelectric layers are substantially laminated on top of each other, with a first electrode layer located beneath the first piezoelectric layer, a second electrode layer sandwiched between the first and second piezoelectric layers, and a third electrode layer lying on top of the second piezoelectric layer.
6. The transducer device of claim 1, wherein the three or more electrodes include a first electrode, a second electrode, and a third electrode.
7. The transducer device of claim 1, wherein the substrate is configured to act as one of the three or more electrodes.
8. The transducer device of claim 7, wherein the first, second and third electrodes are formed from a first electrode layer, second electrode layer, and a third electrode layer, respectively, wherein the first piezoelectric layer is vertically sandwiched between the first and second electrode layers and wherein the second piezoelectric layer is vertically sandwiched between the second and third electrode layers, wherein the first electrode overlies the opening.
9. The transducer device of claim 8, wherein the three or more electrodes further include a fourth electrode formed from the second electrode layer and electrically isolated from the second electrode, wherein the fourth electrode is in the form of an annulus and the second electrode forms a shape inside the annulus that overlies the first electrode.
10. The transducer device of claim 1, wherein the second piezoelectric material is characterized by a transverse piezoelectric coefficient that is larger than a transverse piezoelectric coefficient of the first piezoelectric material.
11. The transducer device of claim 1, wherein the first piezoelectric material is characterized by a dielectric constant that is smaller than a dielectric constant of the second piezoelectric material.
12. The transducer device of claim 1, wherein the second piezoelectric material is characterized by a transverse piezoelectric coefficient that is larger than a transverse piezoelectric coefficient of the first piezoelectric material and wherein the first piezoelectric material is characterized by a dielectric constant that is smaller than a dielectric constant of the second piezoelectric material.
13. The transducer device of claim 1, wherein the first piezoelectric material includes Aluminum Nitride (AlN) or Zinc Oxide (ZnO).
14. The transducer device of claim 1, wherein the second piezoelectric material includes Potassium Sodium Niobate (KNN) or Lead Zirconate Titanate (PZT).
15. The transducer device of claim 1, wherein the first piezoelectric material includes Aluminum Nitride (AlN) or Zinc Oxide (ZnO) and the second piezoelectric material includes Potassium Sodium Niobate (KNN) or Lead Zirconate Titanate (PZT).
16. The transducer device of claim 1, wherein the first and second piezoelectric layers are from 0.2 microns to 6 microns thick.
17. The transducer device of claim 1, wherein the first and second piezoelectric layers are from 0.5 microns to 2.5 microns thick.
18. A method for making a transducer device comprising:
   forming a structural layer with an opening on a substrate;
   forming a first and second piezoelectric layers made of corresponding different first and second piezoelectric materials, wherein one of the first and second piezoelectric material is optimized for transmitter mode operation and another of the first and second piezoelectric materials is optimized for receiver mode operation, wherein the first piezoelectric layer is formed directly on the structural layer over the opening in the substrate;
   depositing two or more conductive electrode layers; and
   forming three or more electrodes in the two or more electrode layers, wherein the first piezoelectric layer is sandwiched between a first pair of electrodes of the three or more electrodes and wherein the second piezoelectric layer is sandwiched between a second pair of electrodes of the three or more electrodes, wherein the first and second pairs of electrodes contain no more than one electrode of the three or more electrodes that is common to both the first pair and the second pair, wherein at least two electrodes are in a same conductive electrode layer.
19. A device, comprising an array containing multiple transducers formed on a common substrate, wherein each of the multiple transducers includes:
   a structural layer for supporting a membrane, the membrane having first and second piezoelectric layers made of corresponding different first and second piezoelectric materials, wherein one of the first and second piezoelectric material is optimized for transmitter mode operation and another of the first and second piezoelectric materials is optimized for receiver mode operation; and
   three or more electrodes, implemented in two or more conductive electrode layers, wherein the first piezoelectric layer is formed directly on the supporting structural layer over an opening in the substrate, wherein the first piezoelectric layer is sandwiched between a first pair of electrodes of the three or more electrodes and wherein the second piezoelectric layer is sandwiched between a second pair of electrodes of the three or more electrodes, wherein the first and second pairs of electrodes contain no more than one electrode of the three or more electrodes that is common to both the first pair and the second pair, wherein at least two electrodes are in a same conductive electrode layer.

* * * * *